United States Patent
Tsuda et al.

(10) Patent No.: US 8,080,861 B2
(45) Date of Patent: Dec. 20, 2011

(54) SEMICONDUCTOR DEVICE

(75) Inventors: Hiroshi Tsuda, Kanagawa (JP);
Yoshitaka Kubota, Kanagawa (JP);
Hiromichi Takaoka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/588,202

(22) Filed: Oct. 7, 2009

(65) Prior Publication Data

US 2010/0096723 A1    Apr. 22, 2010

(30) Foreign Application Priority Data

Oct. 17, 2008   (JP) ................................. 2008-269004

(51) Int. Cl.
*H01L 23/52* (2006.01)
(52) U.S. Cl. ............... 257/529; 257/209; 257/E23.149; 257/E21.498; 438/132; 438/215; 438/281; 438/333; 438/467; 438/601; 337/251; 337/142; 337/159; 337/292
(58) Field of Classification Search .............. 257/209, 257/529, E23.149, E21.498; 438/132, 215, 438/281, 333, 467, 601, FOR. 33; 337/251, 337/142, 159, 292
See application file for complete search history.

(56) References Cited

U.S. PATENT DOCUMENTS

| | | | |
|---|---|---|---|
| 5,420,456 A | 5/1995 | Galbi et al. | |
| 5,608,257 A * | 3/1997 | Lee et al. | 257/529 |
| 7,635,907 B2 | 12/2009 | Ueda | |
| 7,701,035 B2 | 4/2010 | Greco et al. | |
| 7,728,407 B2 | 6/2010 | Ueda | |
| 2004/0262710 A1 * | 12/2004 | Ueda | 257/529 |
| 2006/0289898 A1 | 12/2006 | Kono et al. | |
| 2007/0045783 A1 * | 3/2007 | Ohkubo et al. | 257/665 |
| 2007/0052063 A1 * | 3/2007 | Ueda | 257/529 |
| 2007/0052515 A1 * | 3/2007 | Ueda | 337/401 |
| 2007/0262357 A1 * | 11/2007 | Ueda | 257/249 |
| 2007/0262414 A1 * | 11/2007 | Ueda | 257/529 |
| 2007/0278616 A1 * | 12/2007 | Ueda | 257/529 |
| 2007/0278617 A1 * | 12/2007 | Okada et al. | 257/529 |
| 2008/0122027 A1 * | 5/2008 | Ueda | 257/529 |
| 2008/0217735 A1 | 9/2008 | Chen et al. | |

(Continued)

FOREIGN PATENT DOCUMENTS

CN   101071802 A   11/2007

(Continued)

OTHER PUBLICATIONS

Chinese Office Action dated Mar. 15, 2011, in the English language.

*Primary Examiner* — Meiya Li
(74) *Attorney, Agent, or Firm* — McGinn Intellectual Property Law Group, PLLC

(57) ABSTRACT

A semiconductor device includes an electric fuse and first and second large area wirings for applying a voltage to the electric fuse. The electric fuse includes a fuse unit which includes an upper-layer fuse wiring, a lower-layer fuse wiring, and a via connecting the upper-layer fuse wiring and the lower-layer fuse wiring, an upper-layer lead-out wiring which connects the upper-layer fuse wiring and the first large area wiring and has a bent pattern, and a lower-layer lead-out wiring which connects the lower-layer fuse wiring and the second large area wiring and has a bent pattern.

18 Claims, 12 Drawing Sheets

U.S. PATENT DOCUMENTS

| | | |
|---|---|---|
| 2009/0146251 A1 | 6/2009 | Ueda |
| 2010/0037454 A1 | 2/2010 | Ueda |
| 2010/0159673 A1 | 6/2010 | Ueda |

FOREIGN PATENT DOCUMENTS

| | | |
|---|---|---|
| CN | 101083250 A | 12/2007 |
| CN | 101261979 A | 9/2008 |
| CN | 101322244 A | 12/2008 |
| JP | 6-140510 | 5/1994 |
| JP | 2005-39220 | 2/2005 |
| JP | 2005-197416 | 7/2005 |
| JP | 2007-5424 | 1/2007 |
| JP | 2007-73624 | 3/2007 |
| JP | 2007-305693 | 11/2007 |
| JP | 2007-305939 | 11/2007 |

* cited by examiner

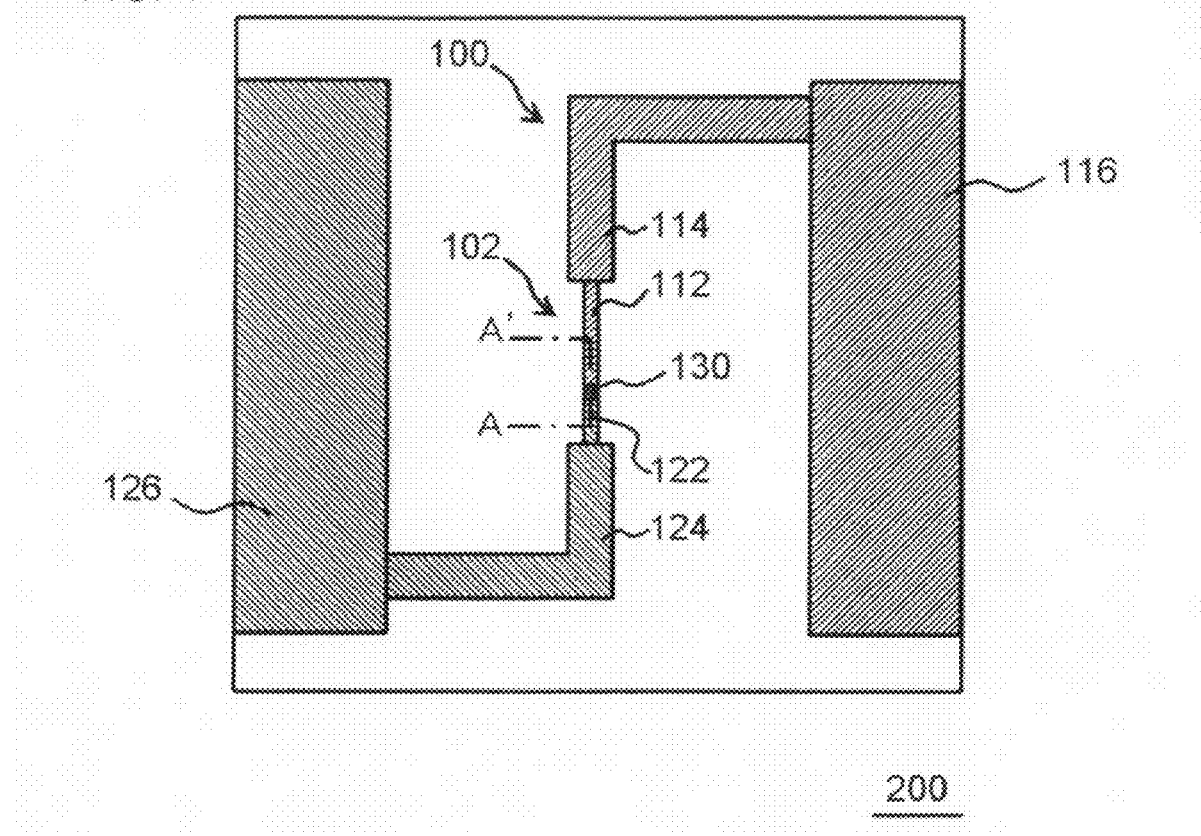

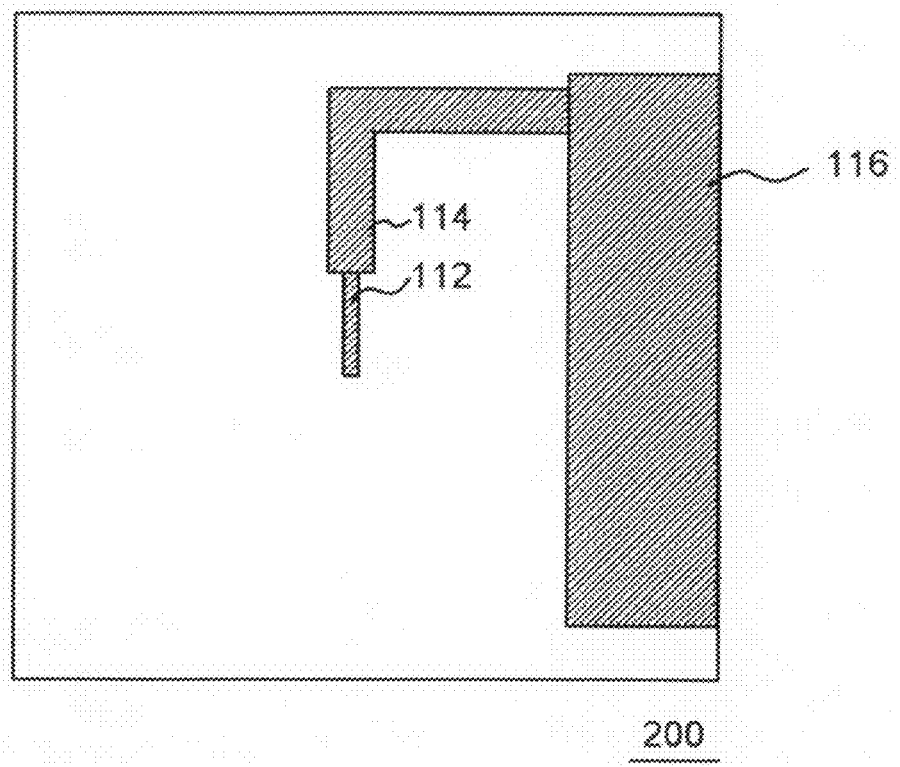
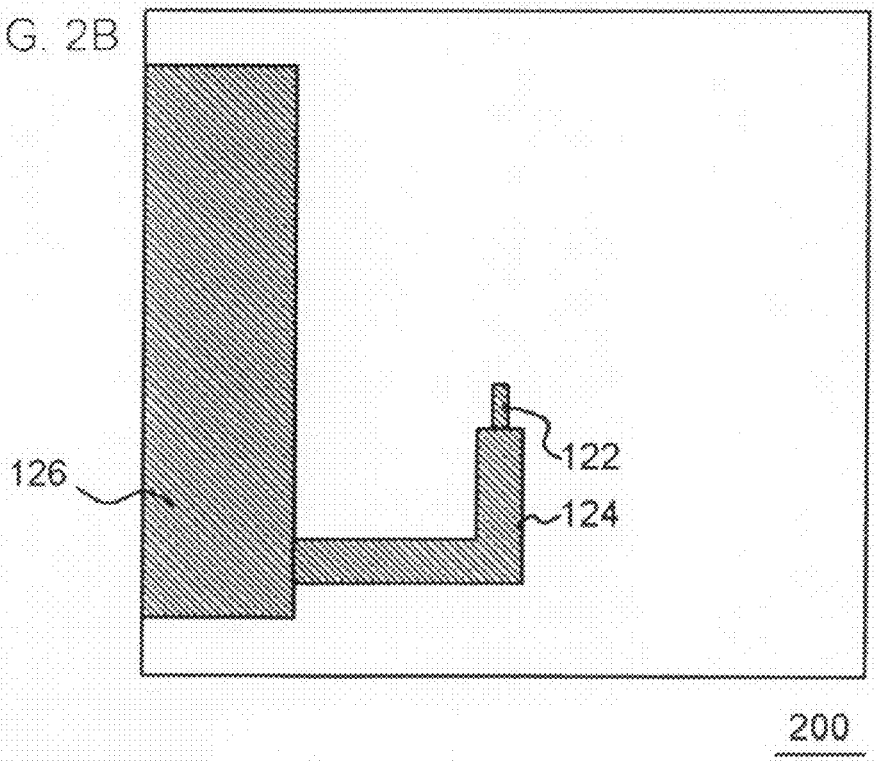

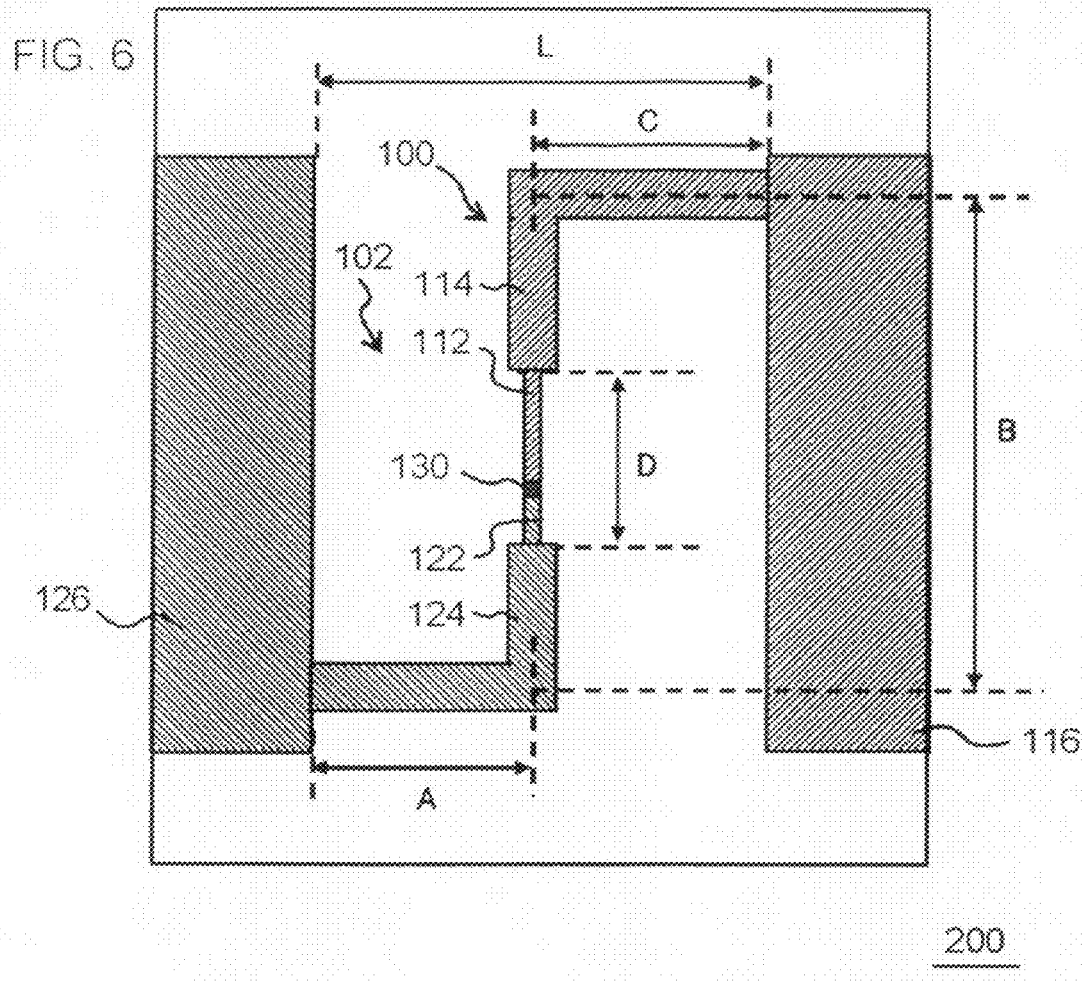

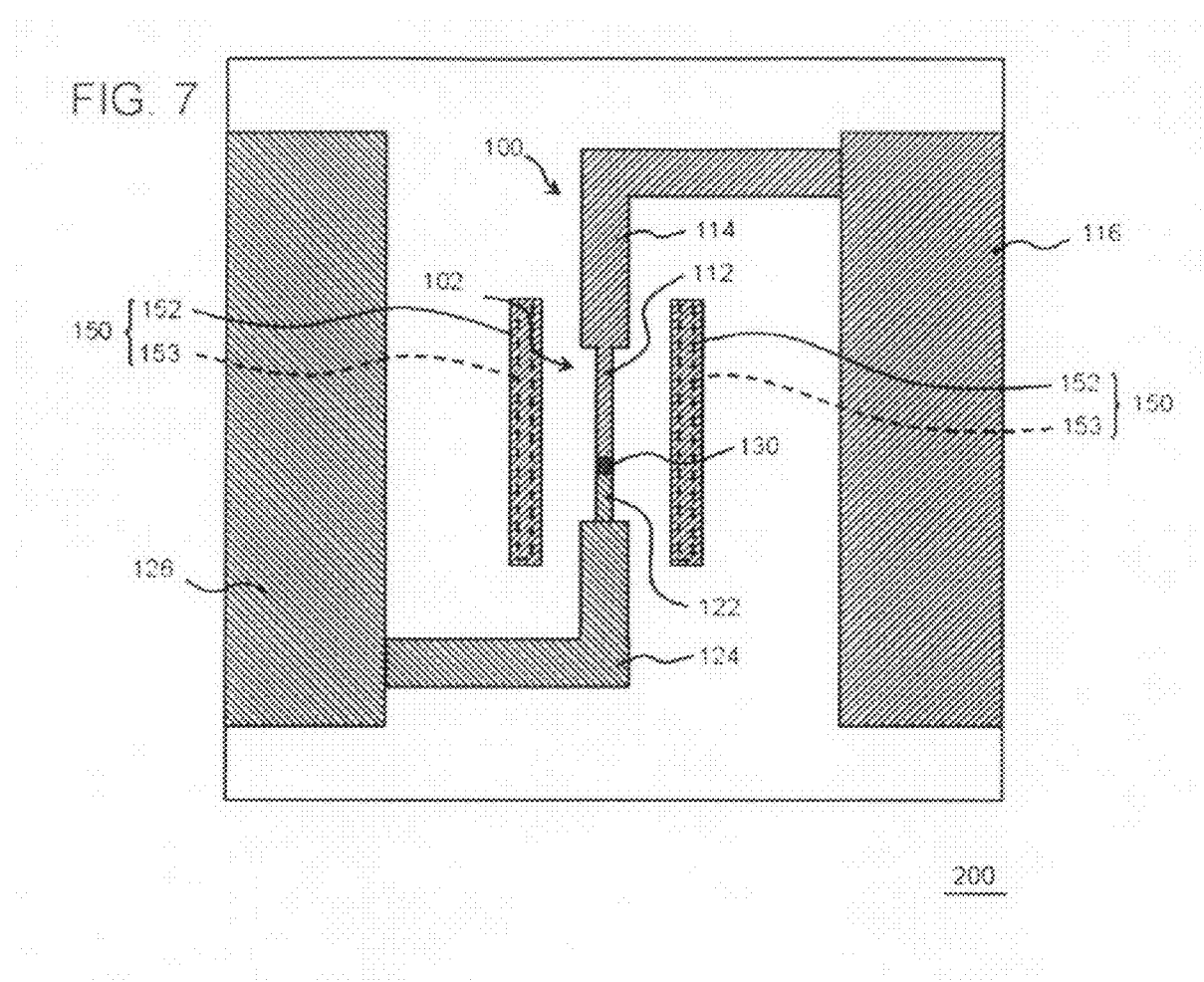

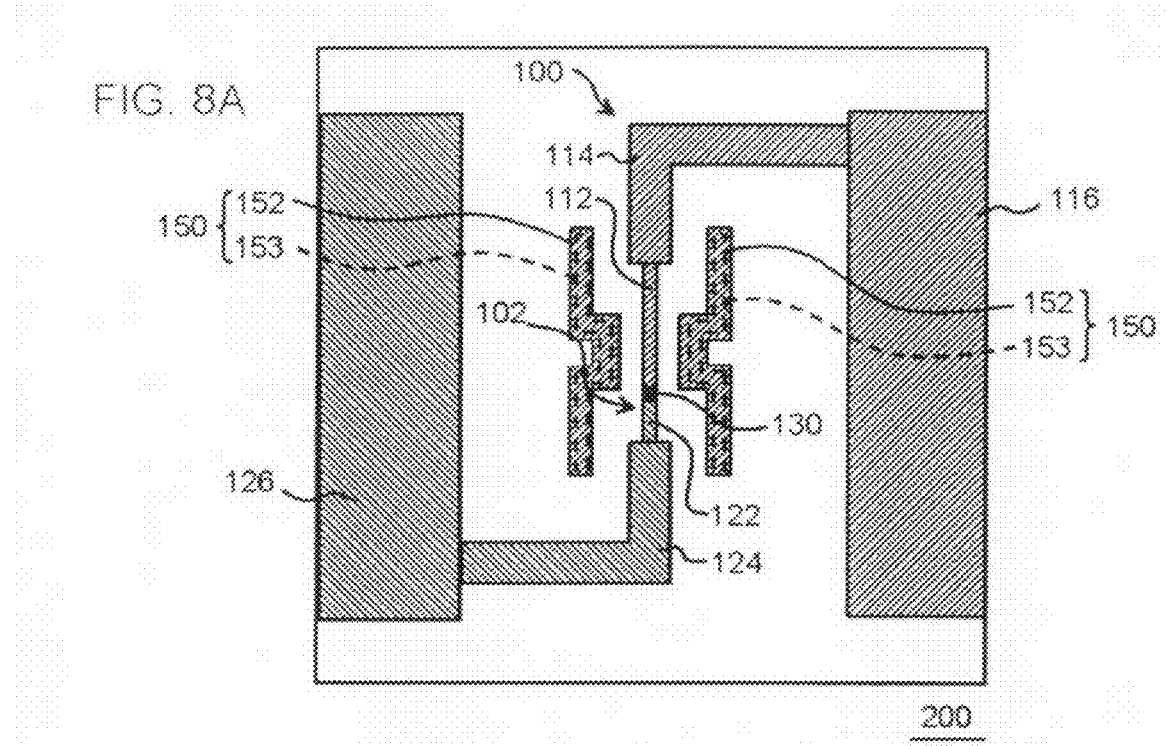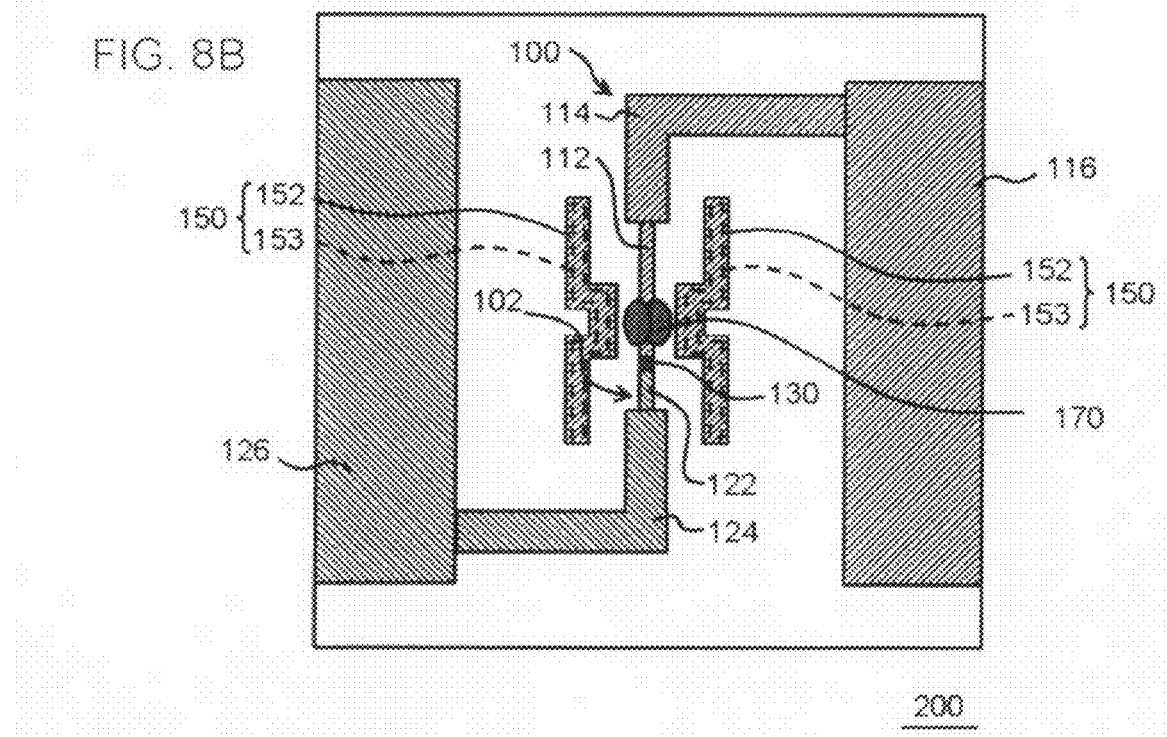

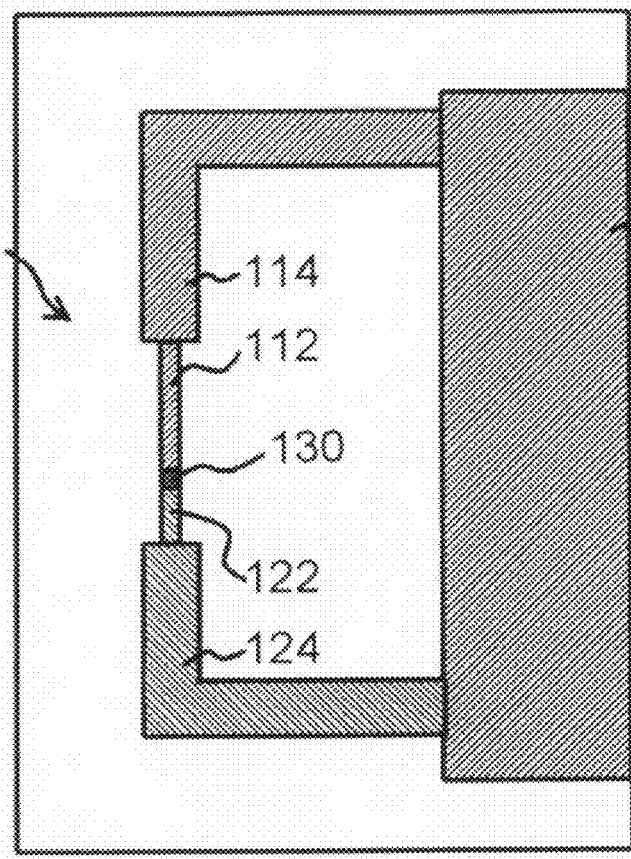

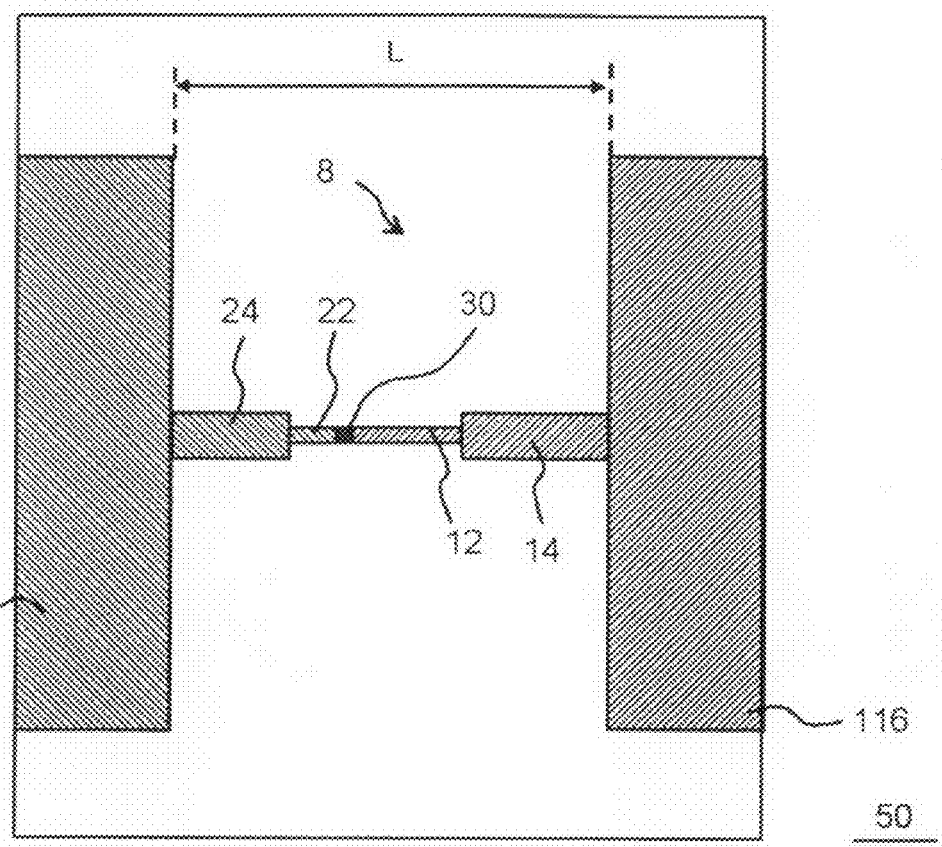

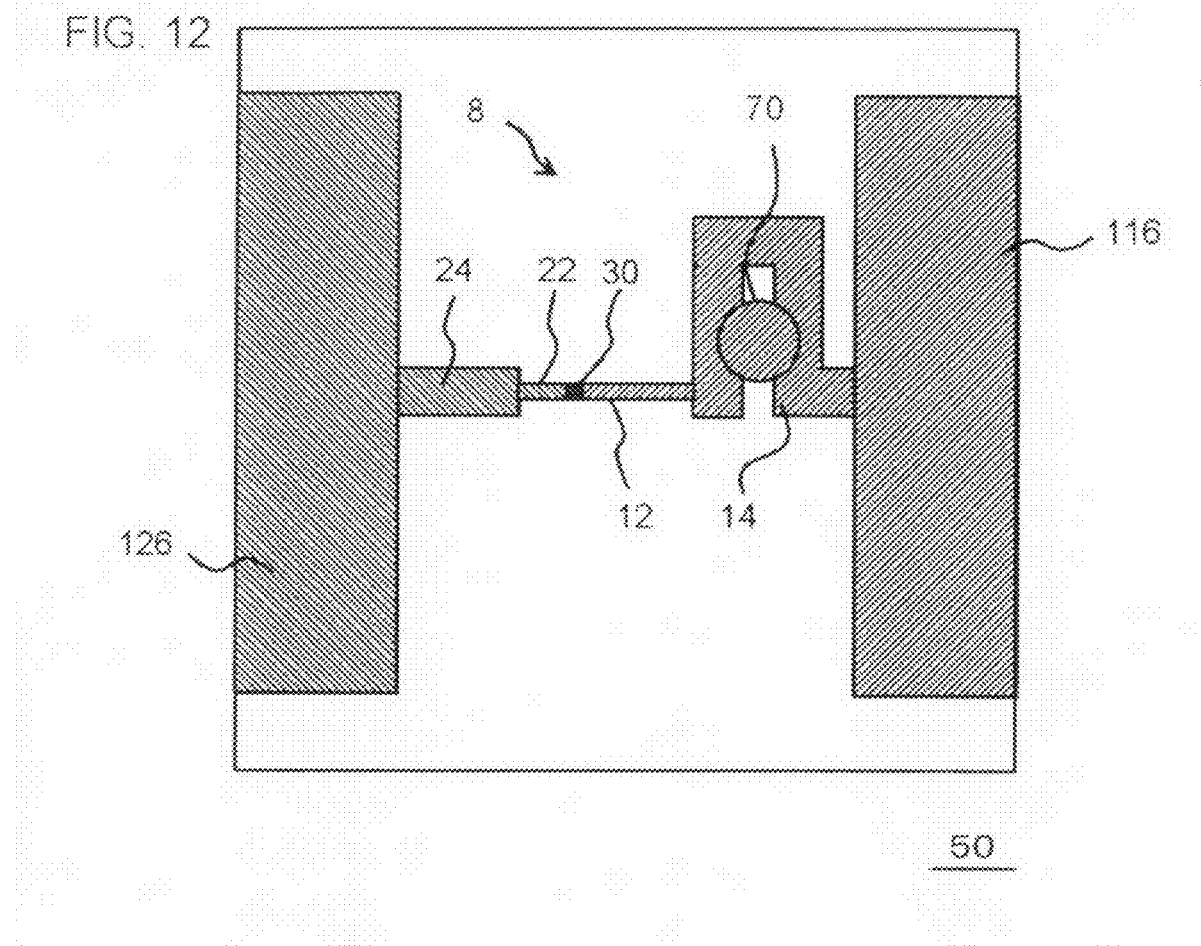

SEMICONDUCTOR DEVICE

This application is based on Japanese patent application NO. 2008-269004, the content of which is incorporated hereinto by reference.

BACKGROUND

1. Technical Field

The present invention relates to a semiconductor device including an electric fuse.

2. Related Art

In recent years, there has been proposed a new method of cutting off an electric fuse, which is called a "crack assist type process." In this method, when an electric fuse is cut off, the structure of the electric fuse and the voltage application to the electric fuse are controlled so as to forcibly cause the conductive material of the electric fuse to flow out at a part of the electric fuse and to flow into the insulating film existing in the vicinity of the conductive material. By doing so, the balance between the material flowing out and being supplied is upset, and a large cut-off portion is formed in another area. In this manner, the probability of a reconnection of a cut-off electric fuse can be significantly reduced, and a desirable cut-off state can be maintained. (for example, see Japanese Laid-open patent publication NOs. 2007-73624, 2007-305693 and 2007-305939).

Japanese Laid-open patent publication NO. 2007-73624 discloses a structure in which a fuse is folded back. With this structure, fuse materials at portions where the fuse is folded back are apt to be heated so as to prompt a cut-off while allowing the fuse to be cut off at other portions, thereby appropriately keeping the cut-off state of the cut-off fuse.

Japanese Laid-open patent publication NOs. 2007-305693 and 2007-305939 disclose an electric fuse including a lower-layer wiring, an upper-layer wiring and a via connecting these layer wirings. With this configuration, for example when a conductor, which is formed from the upper-layer wiring constituting the electric fuse, is ejected outward, a conductor of the via is moved with the movement of the conductor such that a cut-off portion is formed in the via. In this manner, by forming the cut-off portion in the via, it is possible to prevent the electric fuse from being reconnected after the cut-off of the electric fuse.

In addition, Japanese Laid-open patent publication NOs. H-6-140510, 2007-5424, 2005-39220 and 2005-197416 also disclose a structure in which a fuse is folded back. Specifically, Japanese Laid-open patent publication NOs. H-6-140510, 2007-5424 and 2005-39220 disclose a conventional electric fuse in which a material composing the fuse is melted and cut-off by the flow of a current through the fuse. With this configuration, by folding back cut-off portions of the fuse, a current is concentrated on a curved portion of a fuse link, which results in facilitation of the melting of the fuse material. Japanese Laid-open patent publication NO. 2005-197416 discloses a structure in which a fuse is cut-off by a laser. With this structure, by folding back the cut-off portion of the fuse, it is possible to improve the establishment of the cut-off even if the laser beam deviates.

SUMMARY

However, the present inventors have found that the following problems are present even when the electric fuse with the configuration as disclosed in Japanese Laid-open patent publication NOs. 2007-305693 and 2007-305939 is cut-off using the crack assist type process. The cut-off of the electric fuse using the crack assist type process requires a higher application voltage than that for cut-off of a material using the conventional melting method. Thus, the crack assist type process requires the setting of a high application voltage. However, the application voltage may vary due to variation in current deviation or the like of transistors, which is derived from process variation. The present inventors have recognized that the electric fuse with the configuration as disclosed in Japanese Laid-open patent publication NOs. 2007-305693 and 2007-305939 has a problem that an allowable range, in which a cut-off defect does not occur particularly when an application voltage is varied to be decreased, is narrow in the lower limit side.

According to the study by the present inventors, it is believed that the cut-off defect, which occurs when the application voltage is varied to be decreased, is due to the radiation of heat generated in the electric fuse as a large area wiring, such as a common wiring, a pad wiring or the like, which is used for applying a voltage to the electric fuse, functions as a heat sink when the electric fuse is cut-off.

In one embodiment, there is provided a semiconductor device including:

a substrate;

an electric fuse formed over the substrate;

a first large area wiring which is formed in at least a first layer over the substrate for applying a voltage to the electric fuse; and a second large area wiring which is formed in at least a second layer, which is different from the first layer, over the substrate for applying a voltage to the electric fuse, wherein the electric fuse includes:

a fuse unit which includes a first fuse wiring formed in the first layer, a second fuse wiring formed in the second layer, and a via connecting the first fuse wiring and the second fuse wiring, and in which an flowing-out portion of a conductive material constituting the electric fuse and a cutting-off portion are formed when the fuse is cut off;

a first lead-out wiring which is formed in the first layer, connects the first fuse wiring and the first large area wiring, and has a bent pattern; and a second lead-out wiring which is formed in the second layer, connects the second fuse wiring and the second large area wiring, and has a bent pattern.

With the above configuration, it is possible to extend a path through which a current flows from a large area wiring, such as a common wiring or a pad wiring, for applying a voltage to the electric fuse to the fuse unit of the electric fuse (hereinafter referred simply to as "current path"). Accordingly, it is possible to prevent heat generated in the fuse unit from being radiated by the large area wiring which may function as a heat sink. This allows extension in an allowable range of a lower limit such that a cutting-off defect cannot occur even when an application voltage is varied to be decreased due to the deviation.

In addition, by connecting the large area wiring and a fuse link using a lead-out wiring having a bent pattern, it is possible to extend the current paths of the large area wiring and the fuse link without hardly any change in the distance between the large area wiring, which may function as the heat sink, and the fuse link. This allows for an extending of the allowable range of a lower limit of application voltage variation without an increase in area.

In addition, any combinations of the above-mentioned components and changes of the representations of the methods and devices of the present invention are also effective as aspects of the present inventions.

According to the present invention, it is possible to widen the allowable range of application voltage variation without an increase in area.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a schematic plan view showing an example structure of a semiconductor device including an electric fuse according to an embodiment of the present invention;

FIGS. 2A and 2B are schematic plan views showing the example structure of the semiconductor device including the electric fuse according to the embodiment of the present invention;

FIG. 6 is a schematic plan view for explaining the dimension of the semiconductor device 200 shown in FIG. 1;

FIG. 7 is a schematic plan view showing another example structure of the semiconductor device including the electric fuse according to the embodiment of the present invention;

FIGS. 8A and 8B are schematic plan views showing the another example structure of the semiconductor device including the electric fuse according to the embodiment of the present invention;

FIG. 9 is a schematic plan view showing still another example structure of the semiconductor device including the electric fuse according to the embodiment of the present invention;

FIG. 11 is a schematic plan view showing a structure of a semiconductor device including an electric fuse according to a comparative example; and FIG. 12 is a schematic plan view showing another structure of the semiconductor device including the electric fuse according to the comparative example.

DETAILED DESCRIPTION

Figure 3A:
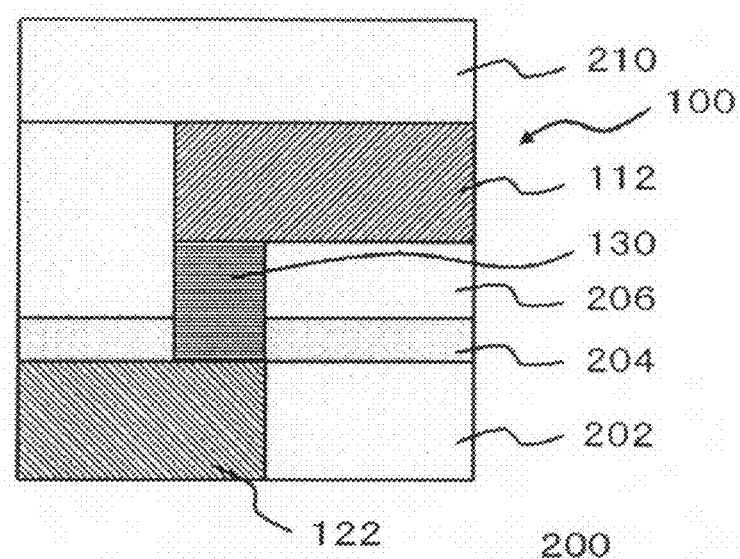
FIGS. 3A and 3B are cross-sectional views of the semiconductor device, taken along line A-A' of FIG. 1.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the present invention will be described with reference to the accompanying drawings. Throughout the drawings, like elements are denoted by like reference numerals and explanation of which will not be repeated.

Figure 3B:
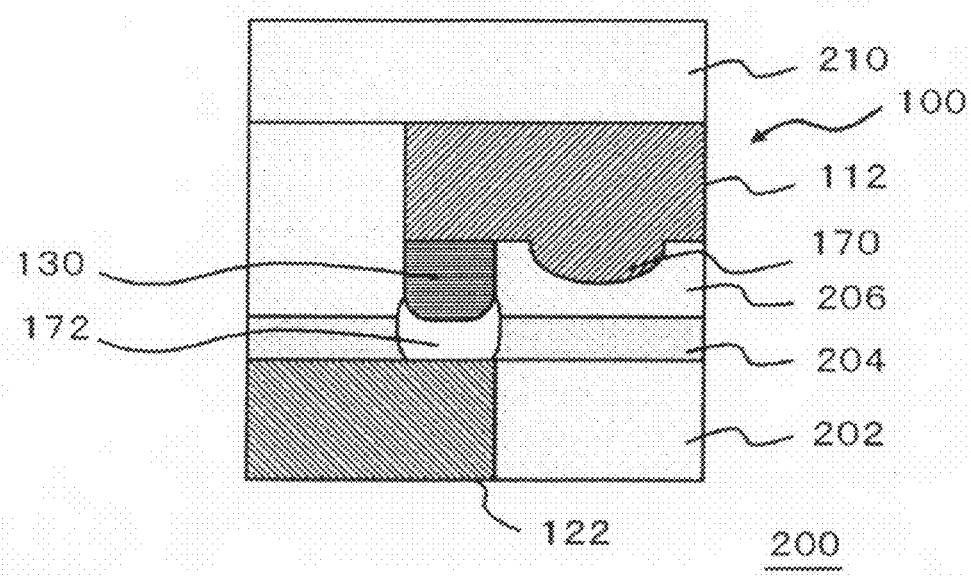

FIGS. 1, 2A and 2B are plan views showing an example structure of a semiconductor device according to an embodiment of the present invention, and FIGS. 3A and 3B are cross-sectional views of the semiconductor device, taken along line A-A' of FIG. 1.

A semiconductor device 200 includes a substrate (not shown) such as a semiconductor substrate, for example, a silicon substrate, an electric fuse 100 formed thereon, and first and second large area wirings 116 and 126 for applying a voltage to the electric fuse 100.

The first large area wiring 116 is formed in at least a first layer on the substrate. The second large area wiring 126 is formed in at least a second layer different from the first layer on the substrate. In this embodiment, the first layer is formed above the second layer. FIG. 2A shows a configuration of the wiring formed in the upper-layer, and FIG. 2B shows a configuration of the wiring formed in the lower-layer. The first and second large area wirings 116 and 126 may be a common wiring, a pad wiring or the like.

The electric fuse 100 includes a fuse unit 102 which is composed of an upper-layer fuse wiring 112 (first fuse wiring) formed in the first layer, a lower-layer fuse wiring 122 (second fuse wiring) formed in the second layer, and a via 130 which connects the upper-layer fuse wiring 112 and the lower-layer fuse wiring 122. When the electric fuse 100 is cut-off, the fuse unit 102 is formed therein with a flowing-out portion, which is produced when a conductive material forming the electric fuse 100 flows out, and a cutting-off portion. In this embodiment, the flowing-out portion is formed when the conductive material forming the electric fuse 100 flows out of the upper-layer fuse wiring 112. In this embodiment, in addition, the cutting-off portion is formed at the via 130 to have the electric fuse 100 cut off.

The electric fuse 100 further includes an upper-layer lead-out wiring 114 (first lead-out wiring), which is formed in the first layer, connects the upper-layer fuse wiring 112 and the first large area wring 116, and has a bent pattern, and a lower-layer lead-out wiring 124 (second lead-out wiring), which is formed in the second layer, connects the lower-layer fuse wiring 122 and the second large area wring 126, and has a bent pattern.

As shown in FIG. 3, in this embodiment, the semiconductor device 200 has a structure in which an interlayer insulating film 202, an etching stopper film 204, an interlayer insulating film 206 and an interlayer insulating film 210 are stacked in this order on the substrate (not shown). FIG. 3A shows a state before the electric fuse 100 is cut-off and FIG. 3B shows a state after the electric fuse 100 is cut-off. These figures do not necessarily show all layers, but appropriate protection films or different etching stopper films may also be formed between the above-mentioned layers. In addition, the layer in which the via 130 is formed and the layer in which the upper-layer fuse wiring 112 is formed may be formed as different interlayer insulating films. The interlayer insulating films may be formed by, for example, a low-dielectric film such as SiOC or the like.

The lower-layer fuse wiring 122 is formed in the interlayer insulating film 202. The via 130 is formed in the etching stopper film 204 and the interlayer insulating film 206. The upper-layer fuse wiring 112 is formed in the interlayer insulating film 206. The via 130 and the upper-layer fuse wiring 112 may be formed using either a dual damascene process or a single damascene process.

The upper-layer fuse wiring 112, the upper-layer lead-out wiring 114, the first large area wiring 116, the lower-layer fuse wiring 122, the lower-layer lead-out wiring 124, the second large area wiring 126 and the via 130 may be formed from a copper-based metal film. Although not shown herein, a barrier metal film may be formed on the side and bottom of each copper-based metal film forming the upper-layer fuse wiring 112, the upper-layer lead-out wiring 114, the first large area wiring 116, the lower-layer fuse wiring 122, the lower-layer lead-out wiring 124, the second large area wiring 126 and the via 130. The barrier metal film may contain metals with high-melting-points. The barrier metal film may be made of, for example, Ta, TaN, Ti, TiN, W, WN or the like.

That is, in the state before the electric fuse 100 is cut-off, the barrier metal film is formed between the lower-layer fuse wiring 122 and the via 130 so that it is in contact with the copper-based metal film forming the lower-layer fuse wiring 122 and the via 130.

Next, procedures for the cutting off the electric fuse 100 in this embodiment will be described.

First, an appropriate power is applied to the electric fuse 100 by applying a predetermined voltage between the first large area wiring 116 and the second large area wiring 126. Although not particularly limited, for example, by applying a high voltage (Vdd) to the second large area wiring 126 and grounding the first large area wiring 116, an appropriate power is applied to the electric fuse 100.

By doing so, the conductive material forming the electric fuse 100 is heated and expanded. At this time, a portion with a current path further away from the first large area wiring 116 or the second large area wiring 126, either of which may function as a heat sink, is apt to be in a higher temperature. Thus, a crack may occur in an insulating film in the vicinity of the fuse unit 102 with a current path further away from the first large area wiring 116 or the second large area wiring 126, thereby causing the conductive material to flow out.

In this embodiment, the upper-layer fuse wiring 112 may be formed to be longer than the lower-layer fuse wiring 122 when seen in a plan view. That is, the fuse unit 102 may be configured as if the center of the entire length of the fuse unit 102 exists in the upper-layer fuse wiring 112. By doing so, a portion with the highest temperature may be formed in the upper-layer fuse wiring 112. In addition, the upper-layer fuse wiring 112 may be formed to have a larger volume than that of the lower-layer fuse wiring 122. For example, the upper-layer fuse wiring 112 may be formed to have a larger width in a direction perpendicular to a direction in which a current flows through the electric fuse 100 (hereinafter referred simply to as a "wiring width") than that of the lower-layer fuse wiring 122. For example, assuming that the wiring width of the lower-layer fuse wiring 122 is 90 nm or so, the wiring width of the upper-layer fuse wiring 112 may be set to be 140 nm or so. By doing so, it can be controlled that a crack occurs in the vicinity of the upper-layer fuse wiring 112 so that the conductive material flows out and that the portion that becomes the highest temperature is formed near the via 130 in the upper-layer fuse wiring 112.

However, the above-mentioned configuration is only by way of example, but any other configuration may be made as long as the upper-layer fuse wiring 112 can be heated more, and accordingly more easily expanded than, the lower-layer fuse wiring 122. As a result, when the electric fuse 100 is cut off, cracks can be selectively controlled so as to easily occur in the vicinity of the upper-layer fuse wiring 112.

As shown in FIG. 3B, according to the expansion of the conductive material, a crack occurs in the interlayer insulating film 206 in the vicinity of the upper-layer fuse wiring 112, and accordingly, the conductive material forming the upper-layer fuse wiring 112 flows into the interlayer insulating film 206. Accordingly, a flowing-out portion 170 is formed in the upper-layer fuse wiring 112. In addition, since the conductive material rapidly moves toward the flowing-out portion 170, the conductive material is cut off at the portion where the movement of the conductive material is too fast to follow the above movement. Since the via 130 is significantly smaller in an area in a plane direction of the substrate than the upper-layer fuse wiring 112 and the lower-layer fuse wiring 122, the conductive material at the via 130 is cut off, thereby forming a cut-off portion 172.

In this embodiment, the upper-layer fuse wiring 112 and the lower-layer fuse wiring 122 may be formed in a non-overlapping fashion except for a region connected to the via 130 when seen in a plan view. By doing so, it is possible to avoid the upper-layer fuse wiring 112 and the lower-layer fuse wiring 122 is connected via the flowing-out portion 170 when the flowing-out portion 170 is formed. In addition, to ensure a connection with the via 130, the upper-layer fuse wiring 112 and the lower-layer fuse wiring 122 are formed to be wider than the diameter of the via 130 and extend from the via 130 in the form of a blind when seen in a plan view. Here, "the region connected to the via 130" is meant to include such a region.

In this embodiment, in addition, since the barrier metal film is formed between the via 130 and the lower-layer fuse wiring 122, the barrier metal film is apt to peel out of the lower-layer fuse wiring 122, and the cutting-off portion 172 is apt to be formed between the barrier metal film and the upper-layer fuse wiring 112. In addition, in the cut-off state, as the conductive material forming the via 130 is moved with the barrier metal film, the cutting-off portion 172 is formed between the barrier metal film and the lower-layer fuse wiring 122. Accordingly, even in subsequent processes such as an annealing process, it is possible to prevent the conductive material formed by the barrier metal or the copper-based metal film from being moved again and reconnected to the lower-layer fuse wiring 122. This allows improvement of heat resistance of the semiconductor device 200.

By cutting off the electric fuse 100 using the crack assist type process with the above-described mechanism, it is ensured that the cutting-off portion 172 is formed in a region different from the flowing-out portion 170. This can prevent a reconnection of the electric fuse 100.

In the electric fuse 100 cut-off using the crack assist type process, Joule heat generated by a current dominates the cutting-off. Accordingly, in order to prevent an undesirable wiring disconnection in portions other than the portion to be cut off, a configuration is required which does not allow the first and second large area wirings 116 and 126 to generate heat even when a large current flow therethrough. In this embodiment, for example, the first and second large area wirings 116 and 126 may be formed from a low resistant wiring such as a wide wiring, a mesh type large area wiring or the like. In addition, the first and second large area wirings 116 and 126 may be formed over a plurality of layers. In this embodiment, each of the first and second large area wirings 116 and 126 may be a large area wiring formed by arranging wiring having a wiring width of, for example, 250 nm to 400 nm in the form of a mesh.

However, such a low resistant wiring may function as a heat sink which radiates heat required to cut off the electric fuse 100. Accordingly, this embodiment may employ an arrangement pattern such that a current path from the first or second large area wiring 116 and 126 to the via 130, which is a cutting-off portion, is lengthened. This allows efficient use of Joule heat generated when a current flows through the electric fuse 100, thereby lowering the lower limit of input power variation.

Returning to FIGS. 1, 2A and 2B, each of the first and second large area wirings 116 and 126 may be configured to have a longer axis in a first direction (vertical direction in these figures). For example, each of the first and second large area wirings 116 and 126 may be configured to extend by a length of 1000 nm or more in the first direction (vertical direction in these figures). In this embodiment, each of the first and second large area wirings 116 and 126 may have a rectangular shape. That is, each of the first and second large area wirings 116 and 126 are provided to extend in the first direction. In this embodiment, the first and second large area wirings 116 and 126 are provided to be opposite to and spaced from each other when seen in a plan view. The electric fuse 100 is provided between the first and second large area wirings 116 and 126 when seen in a plan view.

The upper-layer fuse 112, the via 130 and the lower-layer fuse 122 extend in the first direction and are formed on the same straight line when seen in a plan view. The upper-layer lead-out wiring 114 extends in a second direction (horizontal direction in these figures) perpendicular to the first direction from the first large area wiring 116, is bent at a right angle, then extends in the first direction and connects to the upper-layer fuse wiring 112. Similarly, the lower-layer lead-out wiring 124 extends in the second direction from the second large area wiring 126, is bent at a right angle, then extends in the first direction and connects to the lower-layer fuse wiring 122. Such a configuration can suppress an increase in area and lengthen the current paths of the fuse unit 102 or the first and second large area wirings 116 or 126.

In this embodiment, the upper-layer lead-out wiring 114 may be formed to have a larger wiring width than that of the upper-layer fuse wiring 112 of the fuse unit 102. The lower-layer lead-out wiring 124 may be formed to have a larger wiring width than that of the lower-layer fuse wiring 122 of the fuse unit 102.

In this embodiment, the cutting-off portions of the electric fuse are designed to be in the via 130, unlike the techniques disclosed in Japanese Laid-open patent publication NOs. 2007-73624, Hei-6-140510, 2007-5424, 2005-39220 and 2005-197416. This embodiment provides the upper-layer lead-out wiring 114 and the lower-layer lead-out wiring 124 having a bent pattern in order to lengthen the current paths of the first and second large area wirings 116 and 126 and the fuse unit 102, not to facilitate heating of the wirings, unlike the conventional configurations. Accordingly, the upper and lower-layer lead-out wirings 114 and 124 may be formed to have a wiring width such that the wiring is not to cut off in the upper and lower-layer lead-out wirings 114 and 124 and the wiring is not excessively heated in the bent pattern when a current flows therethrough to cut-off the electric fuse 100.

On the other hand, if the wiring width of the upper and lower-layer lead-out wirings 114 and 124 is made too large, the upper and lower-layer lead-out wirings 114 and 124 may function as a heat sink when a current flows therethrough to cut-off the electric fuse 100, which may result in deterioration of cutting-off efficiency. Accordingly, the upper and lower-layer lead-out wirings 114 and 124 may be formed to have a wiring width that is narrow enough such that the upper and lower-layer lead-out wirings 114 or 124 does not function as a heat sink to effect on the fuse unit 102, when a current flows therethrough to cut-off the electric fuse 100.

The wiring width of the upper-layer lead-out wiring 114 may be set to be, for example, equal to or more than 150 nm and equal to or less than 400 nm. The wiring width of the lower-layer lead-out wiring 124 may be set to be, for example, equal to or more than 150 nm and equal to or less than 400 nm. The wiring widths of the upper and lower lead-out wirings 114 and 124 may be set to be equal to or different from each other. For example, the upper-layer lead-out wiring 114 may have a larger wiring width than that of the lower-layer lead-out wiring 124.

Next, effects of the semiconductor device 200 according to this embodiment will be described.

Figure 4:
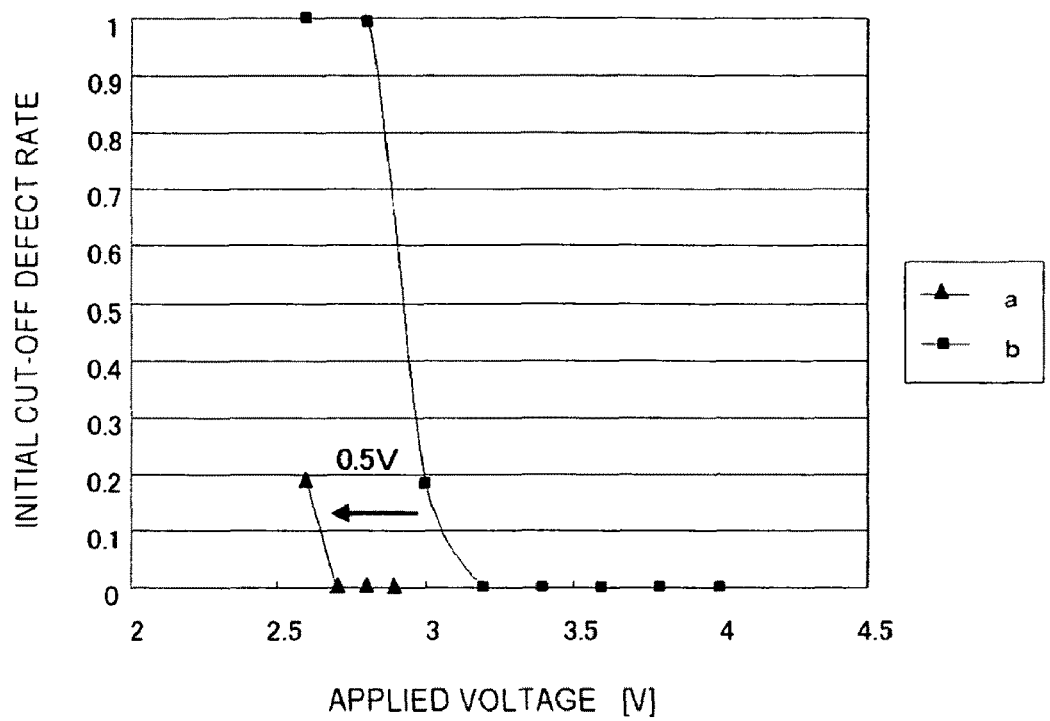
FIG. 4 is a view showing the relationship between an initial cut-off defect and an application voltage when the electric fuse is cut off by applying a voltage to the semiconductor device, according to the embodiment of the present invention.

FIG. 4 is a view showing the relationship between an initial cut-off defect and an application voltage when the electric fuse 100 is cut off by applying a voltage to the semiconductor device 200, according to this embodiment. For the purpose of comparison, this figure also shows the relationship between an initial cut-off defect and an application voltage when an electric fuse 8 is cut off by applying a voltage to a semiconductor device 50 shown in FIG. 11.

As shown in FIG. 11, the electric fuse 8 includes an upper-layer lead-out wiring 14, an upper-layer fuse wiring 12, a via 30, a lower-layer fuse wiring 22 and a lower-layer lead-out wiring 24. A distance between first and second large area wirings 116 and 126 in the semiconductor device 50 is set to be equal to the distance between the first and second large area wirings 116 and 126 in the semiconductor device 200 according to this embodiment. On the other hand, in the semiconductor device 50, the fuse unit composed of the upper-layer fuse wiring 12, the via 30 and the lower-layer fuse wiring 22 extends in a direction different from the extension direction of the first and second large area wirings 116 and 126. In addition, the upper and lower-layer lead-out wirings 14 and 24 of the semiconductor device 50 are configured to have no bent pattern. Accordingly, the upper and lower-layer lead-out wirings 14 and 24 of the semiconductor device 50 shown in FIG. 11 are respectively formed to be shorter than the upper and lower-layer lead-out wirings 114 and 124 of the semiconductor device 200 according to this embodiment.

Returning to FIG. 4, as indicated in the figure, "a" and "b" respectively show results obtained from the semiconductor devices 200 of FIG. 1 and the semiconductor device 50 of FIG. 11. It can be seen from the shown results that the semiconductor device 200 exhibits hardly any initial cut-off defects with an application voltage of 3V, while the semiconductor device 50 exhibits initial cut-off defects of 20 percents or so with the same application voltage. The semiconductor device 200 exhibits initial cut-off defects of 20 percents or so with an application voltage of 2.5 V or so, which means that the allowable range of a lower limit of the application voltage variation can be widened by 0.5 V as compared to the semiconductor device 50.

Figure 5:
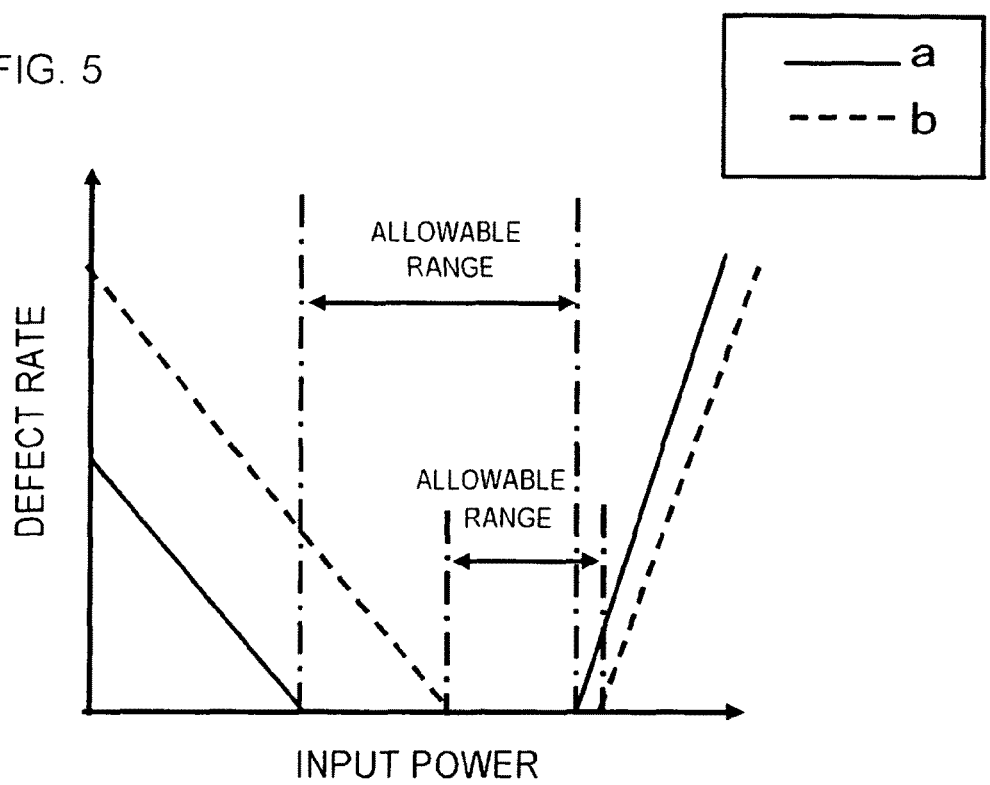
FIG. 5 is a view showing the relationship between an input power (application voltage) and a defect rate for each of the semiconductor device according to the embodiment of the present invention and a comparative example.

FIG. 5 is a view showing the relationship between an input power (application voltage) and a defect rate for each of the semiconductor device 200 of FIG. 1 and the semiconductor device 50 of FIG. 11. As indicated in FIG. 5, "a" and "b" respectively show results obtained from the semiconductor devices 200 and the semiconductor device 50. It can be seen from FIG. 5 that the semiconductor device 200 can have a wider allowable range of a lower limit of the application voltage variation as compared to the semiconductor device 50.

On the other hand, when the electric fuse is cut off using the crack assist type process, if excessive power is input, for example, an insulating film beside the via 130 is lost, and accordingly, even when a cutting-off portions occurs in the via, a defect may occur where the resistance in the electric fuse decreases due to movement of a conductive material to the portion where the insulating film is lost by thermal hysteresis of a subsequent assembly process or temporal variation. Accordingly, in order to determine a characteristic of the electric fuse, it is also required to consider the allowable range of an upper limit of the application voltage variation. FIG. 5 also shows the result of a defect rate when the input power is increased. As shown, in the upper limit side of the input power, the semiconductor device 50 has a slightly wider allowable range than that of the semiconductor device 200, but a difference therebetween is not large.

In the electric fuse formed by the upper-layer wiring-the via-the lower-layer wiring as in the semiconductor device 200 and the semiconductor device 50, the allowable range of the upper limit of the application voltage variation depends on the local layout of the fuse units (the upper-layer wiring-the via-the lower-layer wiring). Accordingly, if the fuse units have the same layout, there is hardly any change in the allowable range of the upper limit of the application voltage variation regardless of the structure around the fuse unit. Thus, it is believed that with this reason, there is hardly any difference in the semiconductor device 200 and the semiconductor device 50 in terms of the allowable range of the upper limit of the input power therebetween.

As described above, the semiconductor device 200 can have a larger width of allowable range (cut-off window) in terms of the input power in which a cut-off defect does not occur, compared to the semiconductor device 50, by lengthening the current paths of the fuse unit 102 and the first and second large area wirings 116 and 126 in the semiconductor device 200. This allows provision of a system robust to variations such as current deviations or the like of transistors which is derived from process variation.

In addition, with the semiconductor device 200 according to this embodiment, it is possible to widen the allowable range of the application voltage variation without an increase in area. The present inventors have found that the amount to which the first and second large area wirings 116 and 126, which may function as heat sinks, influence the cutting-off efficiency of the electric fuse 100 depends on the current paths of the fuse unit 102 and the first and second large area wirings 116 and 126, and not the distance between the fuse unit 102 and the first or second large area wiring 116 or 126.

For example, thermal conductivity of copper, which is the main component of the copper-based metal film forming the wirings, is $3.9\times10^{-4}$ (W/μm·K). On the other hand, thermal conductivity of $SiO_2$, which is a typical insulating film material, is $1.5\times10^{-6}$ (W/μm·K). Thermal conductivity of material forming a low-dielectric film is even smaller than that of $SiO_2$. Accordingly, even if the distance from the first or second large area wiring 116 or 126, which may function as the heat sink, is slightly small, the effect of heat radiation by the heat sink is insignificant if the insulating film exists therebetween. In the meantime, most of Joule heat generated is radiated through the wirings. Accordingly, in this embodiment, the current path from the first or second large area wiring 116 or 126 to the fuse unit 102 is configured so as to not be in a straight line when seen in a plan view. Specifically, in this embodiment, the first and second large area wirings 116 and 126 and the fuse unit 102 are connected to the upper and lower-layer lead-out wirings 114 and 124 having the bent pattern. This allows extension of the current paths of the first and second large area wirings 116 and 126 and the fuse unit 102 without changing the distance of the large area wirings and the fuse unit and without an increase in area. Accordingly, the heat radiation can be effectively reduced, which may result in a wider allowable range of the lower limit of the application voltage variation.

FIG. 6 is a plan view for explaining the dimension of the semiconductor device 200 shown in FIG. 1.

In this figure, it is assumed that the distance between the first and second large area wirings 116 and 126 is L, the length from a contact portion between the lower-layer lead-out wiring 124 and the second large area wiring 126 to a bent portion is A, and the length from a contact portion between the upper-layer lead-out wiring 114 and the first large area wiring 116 to a bent portion is C, when seen in a plan view. In this case, a relationship of L=A+C is established. Additionally, it is assumed that the length of a straight line section from the bent portion of the upper-layer lead-out wiring 114 to the bent portion of the lower-layer lead-out wiring 124, including the upper-layer fuse wiring 112 and the lower-layer fuse wiring 122, is B and the length of the fuse unit 102 is D.

Here, the length B has to be large to a certain extent since it is required to be set depending on the size of transistors, a read circuit and so on used in order to cut off the electric fuse 100. In this embodiment, when a value of L/B is set to be, for example, equal to or more than 0.5 and equal to or less than 2, the effect of area saving increases. In addition, the length D of the fuse unit 102 is set so as to satisfy an electrical characteristic of the electric fuse 100. In this embodiment, when a value of (A+B+C)/D, which is a division of the entire length (A+B+C) by the length D of the fuse unit 102, is designed to be, for example, equal to or more than 3 and equal to or less than 6, the effect of area saving increases. This allows for an extension of an allowable range of the application voltage variation without an increase in area.

In the example shown in FIG. 11, the distance between the first and second large area wirings 16 and 26 is the same L as in the electric fuse 100 in this embodiment shown in FIG. 6. In this embodiment, it is possible to extend the current path from the first and second large area wirings 116 and 126 to the fuse unit 102 without an increase in area.

OTHER EMBODIMENTS

FIGS. 7, 8A and 8B are views showing a configuration where a guard portion 150 is formed in the vicinity of the fuse unit 102 of the electric fuse 100.

In the example shown in FIG. 7, the guard portion 150 is formed in a linear fashion when seen in a plan view. The guard portion 150 may be provided in both sides of the fuse unit 102 of the electric fuse 100. The guard portion 150 may include a guard lower-layer wiring (not shown) formed in the same layer as the lower-layer fuse wiring 122, a guard lower-layer via 153 formed in the same layer as the via 130, a guard upper-layer wiring 152 formed in the same layer as the upper-layer fuse wiring 112, a guard upper-layer via (not shown) formed in the upper layer of the guard upper-layer wiring 152, and an upper plate (not shown) formed in the upper layer of the guard upper-layer via. The upper plate may be configured to cover the entire region between two guard portions 150. The stacked guard upper-layer wiring 152, guard lower-layer via 153 and guard lower-layer wiring of the guard portion 150 are successively formed across layers in which the upper-layer fuse wiring 112, the via 130, and the lower-layer fuse wiring 122 are formed. In addition, the stacked guard upper-layer wiring 152, guard lower-layer via 153 and guard lower-layer wiring of the guard portion 150 are formed in the same shape when seen in a plan view. Here, the guard portion 150 may be in a floating state in which it is not electrically connected to other elements.

With the above-described configuration, when the flowing-out portion 170 is formed in the upper-layer fuse wiring 112, the conductive material forming the upper-layer fuse wiring 112 is prevented from being scattered around even when the conductive material erupts. In addition, in this embodiment, the guard portion 150 may be configured to extend in the same direction as the first and second large area wirings 116 and 126 when seen in a plan view. That is, the guard portion 150 is provided substantially parallel to the first and second large area wirings 116 and 126. This can prevent the flows of the conductive material from contacting the first and second large area wirings 116 and 126 even after the conductive material flows out, which may result in sharp decrease in the possibility of leak generation due to drift of the flows of conductive material. In addition, in this embodiment, since the guard portion 150 is in a floating state, even if the upper-layer fuse wiring 112 contacts the guard portion 150, it has no effect on determining the cutting-off state of the electric fuse 100, and resistance of the electric fuse 100 is unchanged.

In the example shown in FIGS. 8A and 8B, the two guard portions 150 formed at both sides of the fuse unit 102 do not have a linear shape but a bent shape in a portion where the upper-layer fuse wiring 112 is formed, when seen in a plan view, such that these guard portions are arranged closer to the electric fuse 100 than other regions.

In this example, the guard portion 150 may include a guard lower-layer wiring (not shown) formed in the same layer as the lower-layer fuse wiring 122, a guard lower-layer via 153 formed in the same layer as the via 130, a guard upper-layer wiring 152 formed in the same layer as the upper-layer fuse wiring 112, a guard upper-layer via (not shown) formed in the upper layer of the guard upper-layer wiring 152, and an upper plate (not shown) formed in the upper layer of the guard upper-layer via. The stacked guard upper-layer wiring 152, guard lower-layer via 153 and guard lower-layer wiring of the guard portion 150 are successively formed across layers in which the upper-layer fuse wiring 112, the via 130, and the lower-layer fuse wiring 122 are formed. In addition, the stacked guard upper-layer wiring 152, guard lower-layer via 153 and guard lower-layer wiring of the guard portion 150 are formed in the same shape when seen in a plan view. Here, the guard portion 150 may be in a floating state in which it is not electrically connected to other elements.

In addition, in this example as well, since the guard portion 150 is in a floating state, even if the upper-layer fuse wiring 112 contacts the guard portion 150, it has no effect on determining the cutting-off state of the electric fuse 100, and resistance of the electric fuse 100 is unchanged. On the other hand, when each of the upper and lower-layer fuse wirings 112 and 122 contact the guard portions 150, after the cutting off the electric fuse 100, since the upper and lower-layer fuse wirings 112 and 122 are electrically connected through the guard portions 150, there is a possibility of misjudging the cutting-off state of the electric fuse 100.

In this example, the distance between the guard upper-layer wiring 152 and the upper-layer fuse wiring 112 in the layer on which the upper-layer fuse wiring 112 is formed is narrower than the distance between the guard lower-layer wiring and the lower-layer fuse wiring 122 in the layer on which the lower-layer fuse wiring 122 is formed. With this configuration, by arranging the guard upper-layer wiring 152 in the vicinity of the upper-layer fuse wiring 112 and widening the distance between the lower-layer fuse wiring 122 and the guard lower-layer wiring, even if the conductive material forming the lower-layer fuse wiring 122 flows out, the conductive material does not contact the guard lower-layer wiring. This can prevent a circuit-short between the upper and lower-layer fuse wirings 112 and 122 with the guard portion 150 interposed therebetween.

Figure 10A:
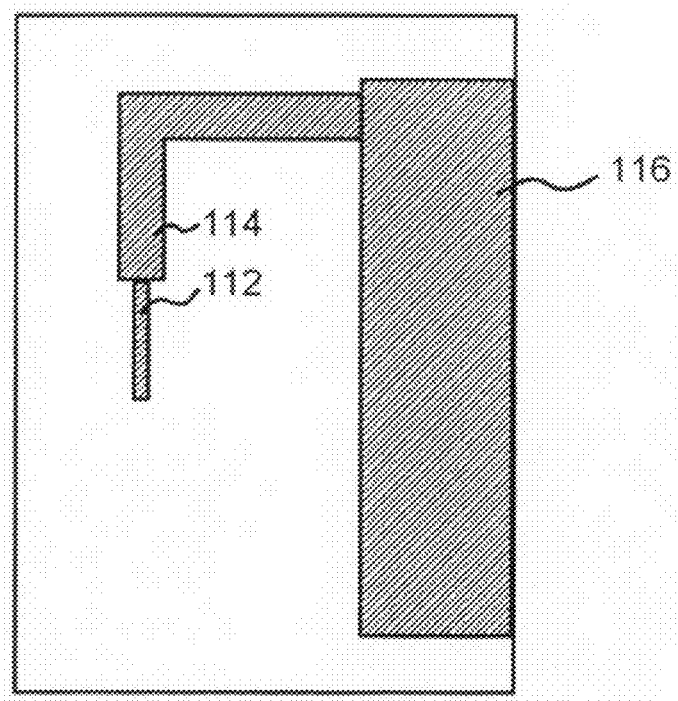
FIGS. 10A and 10B are schematic plan views showing the still another example structure of the semiconductor device including the electric fuse according to the embodiment of the present invention.
Figure 10B:
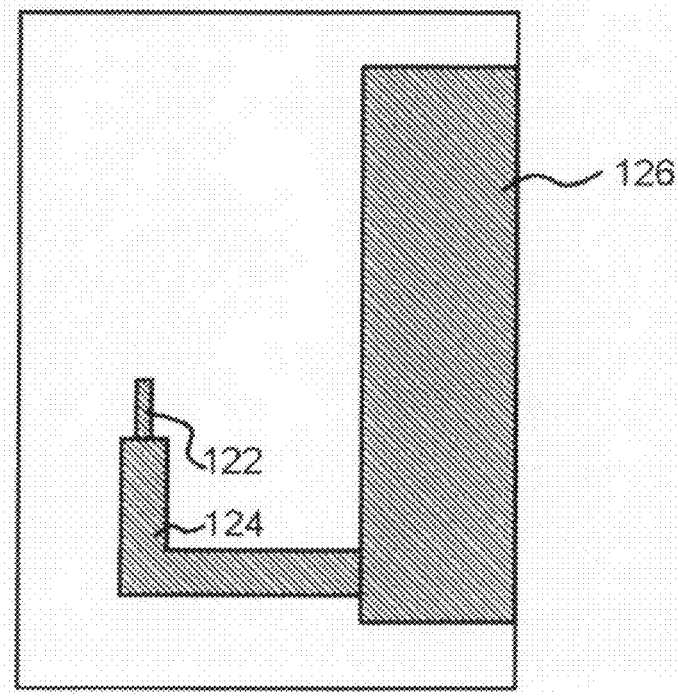

FIGS. 9, 10A and 10B show another example.

Although the example of FIG. 1 shows the configuration where the first and second large area wirings 116 and 126 are provided to be opposite to and spaced from each other when seen in a plan view, the first and second large area wirings 116 and 126 may be configured to be stacked or overlapped when seen in a plan view. Here, the first lead-out wiring 114 and the second lead-out wiring 124 are connected with the first large area wiring 116 and the second large area wiring 126, respectively, at the different position when seen in a plan view. Also with this configuration, it is possible to widen the allowable range of the application voltage variation without an increase in area by employing this configuration as a layout of the electric fuse 100 in this embodiment.

In addition, in this embodiment, as described above, the upper and lower-layer lead-out wirings 114 and 124 are required to be configured such that the bent pattern is not excessively heated when a current flows therethrough to cut-off the electric fuse 100. Accordingly, it is preferable that the upper and lower-layer lead-out wirings 114 and 124 are configured such that they do not have a parallel extending region by being bent once and bent again so as to be folded back.

FIG. 12 is a view showing an example of the semiconductor device 50 in which upper-layer lead-out wiring 14 has a parallel extending region due to it being folded back. Like those shown in FIG. 11, the electric fuse 8 includes the upper-layer lead-out wiring 14, the upper-layer fuse wiring 12, the via 30, the lower-layer fuse wiring 22 and the lower-layer lead-out wiring 24. The upper-layer lead-out wiring 14 has a parallel extending region due to it being folded back. With this configuration, the upper-layer lead-out wiring 14 is apt to be heated in the folded-back portion and a parallel extending portion. Accordingly, there is a high possibility of cutting-off of the electric fuse 8 in the portion of the upper-layer lead-out wiring 14, not in the portion of the via 30. If the electric fuse 8 is cut off in the upper-layer lead-out wiring 14, the advantage that it is difficult for a reconnection to occur when the electric fuse 8 is cut off in the via is not possible to be achieved. In addition, if the flowing-out portion 70 is formed in the upper-layer lead-out wiring 14 at the parallel extending portion, this increases the risk of the occurrence of a leak path (circuit-short) such that a reconnection is formed in spite of there being a cut-off. From the above description, in this embodiment, it is preferable that the upper and lower-layer lead-out wirings 114 and 124 have no parallel extending region due to being folded back.

While the exemplary embodiments of the present invention have been described with reference to the drawings, the disclosed embodiments are only illustrative and may employ other different configurations.

While it has been illustrated in the above embodiments that the first layer is above the second layer and the flowing-out portion 170 is formed in the upper-layer fuse wiring 112 on the upper layer, it may be configured that the second layer is above the first layer and the flowing-out portion 170 is formed in the lower-layer fuse wiring 122 in the lower layer.

It is apparent that the present invention is not limited to the above embodiments, and may be modified and changed without departing from the scope and spirit of the invention.

What is claimed is:

1. A semiconductor device comprising:
a substrate;
an electric fuse formed over said substrate;
a first large area wiring which is formed in at least a first layer over said substrate for applying a first voltage to said electric fuse;
a second large area wiring which is formed in at least a second layer, which is different from said first layer, over said substrate for applying a second voltage to said electric fuse; and
a guard portion formed on at least one side of the electric fuse and entirely parallel to the first large area wiring and the second large area wiring when seen in a plan view and entirely parallel to the first large area wiring and the second large area wiring when seen from a top view,
wherein said electric fuse includes:
a fuse unit which includes a first fuse wiring formed in said first layer, a second fuse wiring formed in said second layer, and a via connecting said first fuse wiring and said second fuse wiring, and in which a flowing-out portion of a conductive material constituting said electric fuse and a cutting-off portion are formed when said fuse is cut off;
a first lead-out wiring which is formed in said first layer, connects said first fuse wiring and said first large area wiring, and has a bent pattern; and
a second lead-out wiring which is formed in said second layer, connects said second fuse wiring and said second large area wiring, and has a bent pattern.

2. The semiconductor device as set forth in claim 1, wherein, in said fuse unit, said flowing-out portion is formed by flowing out said conductive material constituting said electric fuse from said first fuse wiring.

3. The semiconductor device as set forth in claim 1, wherein, in said fuse unit, said cutting-off portion is formed at said via.

4. The semiconductor device as set forth in claim 2, wherein, in said fuse unit, said cutting-off portion is formed at said via.

5. The semiconductor device as set forth in claim 1, wherein said first lead-out wiring is formed to have a larger wiring width than that of said first fuse wiring, and
wherein said second lead-out wiring is formed to have a larger wiring width than that of said second fuse wiring.

6. The semiconductor device as set forth in claim 1, wherein said first large area wiring and said second large area wiring are provided to extend in a first direction, respectively and
wherein said first fuse wiring, said via and said second fuse wiring are formed to extend on the same straight line in said first direction when seen in a plan view.

7. The semiconductor device as set forth in claim 6, wherein said first lead-out wiring extends in a second direction perpendicular to said first direction from said first large area wiring, is bent at a right angle, and then extends in said first direction to be connected to said first fuse wiring, and
wherein said second lead-out wiring extends in said second direction from said second large area wiring, is bent at a right angle, and then extends in said first direction to be connected to said second fuse wiring.

8. The semiconductor device as set forth in claim 6, wherein said first large area wiring and said second large area wiring are provided to be opposite to and spaced from each other when seen in a plan view, and
wherein said first fuse wiring, said via and said second fuse wiring are provided between said first large area wiring and said second large area wiring when seen in a plan view.

9. The semiconductor device as set forth in claim 7, wherein said first large area wiring and said second large area wiring are provided to be opposite to and spaced from each other when seen in a plan view, and
wherein said first fuse wiring, said via and said second fuse wiring are provided between said first large area wiring and said second large area wiring when seen in a plan view.

10. The semiconductor device as set forth in claim 1, wherein said first fuse wiring is formed to have a larger volume than that of said second fuse wiring.

11. The semiconductor device as set forth in claim 1, wherein said first layer is provided above said second layer, each of said first fuse wiring, said second fuse wiring and said via is formed by a copper-containing metal film and a barrier metal film which covers the side and bottom of the copper-containing metal film, and said barrier metal film is provided between said second fuse wiring and said via to be kept in contact with the copper-containing metal film forming said second fuse wiring and said via before cutting-off.

12. The semiconductor device as set forth in claim 1, wherein said first fuse wiring and said second fuse wiring are formed in a non-overlapping fashion except for a region connected to said via when seen in a plan view.

13. The semiconductor device as set forth in claim 1, wherein a value of L/B is set to be equal to or more than 0.5 and equal to or less than 2.0,
wherein B is a length from the bent portion of the first lead-out wiring to the bent portion of the second lead-out wiring and L is a distance between the first large area wiring and the second large area wiring.

14. The semiconductor device as set forth in claim 1, wherein said via has an area smaller than an area of said first fuse wiring and said second fuse wiring.

15. The semiconductor device as set forth in claim 1, wherein a width of said first fuse wiring and a width of said second fuse wiring is larger than a diameter of said via.

16. The semiconductor device as set forth in claim 1, wherein the cutting-off portion is formed between said barrier metal film and said first fuse wiring.

17. The semiconductor device as set forth in claim 1, wherein said guard portion comprises one of a pair of guard portions, said pair of guard portions formed on opposing sides of said electric fuse.

18. The semiconductor device as set forth in claim 1, wherein said guard portion extends along an entire length of said fuse unit.

* * * * *